(12) United States Patent
Prikhodko et al.

(10) Patent No.: US 7,492,209 B2
(45) Date of Patent: Feb. 17, 2009

(54) HIGH-FREQUENCY SWITCHING DEVICE WITH REDUCED HARMONICS

(75) Inventors: Dima Prikhodko, Burlington, MA (US); Sergey Nabokin, Pelham, NH (US); Steven C. Sprinkle, Hampstead, NH (US); Mikhail Shirokov, Methuen, MA (US); Gene A. Tkachenko, Belmont, MA (US); Jason Chiesa, Pelham, NH (US)

(73) Assignee: Skyworks Solutions, Inc., Irvine, CA (US)

( * ) Notice: Subject to any disclaimer, the term of this patent is extended or adjusted under 35 U.S.C. 154(b) by 172 days.

(21) Appl. No.: 11/492,504

(22) Filed: Jul. 24, 2006

(65) Prior Publication Data
US 2007/0243849 A1    Oct. 18, 2007

Related U.S. Application Data

(60) Provisional application No. 60/792,790, filed on Apr. 17, 2006.

(51) Int. Cl.
 *H03K 17/00* (2006.01)
 *H03K 17/16* (2006.01)
(52) U.S. Cl. .............. 327/384; 327/390; 327/404; 327/408

(58) Field of Classification Search ............ 327/384, 327/390, 404, 408
See application file for complete search history.

(56) References Cited

U.S. PATENT DOCUMENTS

| | | | |
|---|---|---|---|
| 6,642,578 B1 * | 11/2003 | Arnold et al. | 257/341 |
| 6,803,680 B2 | 10/2004 | Brindle et al. | |
| 6,804,502 B2 | 10/2004 | Burgener et al. | |
| 7,098,755 B2 * | 8/2006 | Zhao et al. | 333/101 |
| 7,199,635 B2 | 4/2007 | Nakatsuka et al. | |

* cited by examiner

*Primary Examiner*—Evan Pert
(74) *Attorney, Agent, or Firm*—Lowrie, Lando & Anastasi, LLP (57) ABSTRACT

According to one exemplary embodiment, a low harmonic switching device includes a first switching block including a first multi-gate FET, where the first switching block is coupled to a first input and a shared output of the low harmonic switching device. A first capacitor is coupled between a first gate and a source of the first multi-gate FET and a second capacitor is coupled between a second gate and a drain of the first multi-gate FET so as to cause a reduction in a harmonic amplitude in the shared output. A resistor can couple the source to the drain of the first multi-gate FET. The first switching block can further include a second multi-gate FET, where a source of the second multi-gate FET is coupled to the drain of the first multi-gate FET and a drain of the second multi-gate FET is coupled to the shared output.

21 Claims, 5 Drawing Sheets

Fig. 1

(Prior Art)

Fig. 5

HIGH-FREQUENCY SWITCHING DEVICE WITH REDUCED HARMONICS

The present application claims the benefit of and priority to a pending provisional patent application entitled "High-Frequency Switching Device with Reduced Harmonics," Ser. No. 60/792,790 filed on Apr. 17, 2006. The disclosure in that pending provisional application is hereby incorporated fully by reference into the present application.

BACKGROUND OF THE INVENTION

1. Field of the Invention

The present invention is generally in the field of electrical circuits. More specifically, the invention is in the field of high-frequency switching circuits.

2. Related Art

High-frequency switching devices, such as high-frequency switching devices having multiple inputs and a shared output, can be used in mobile communication devices, such as cellular handsets, to provide operation at more than one frequency. For example, a high-frequency switching device can be used in a cellular handset operating in a system using a global system for mobile communications (GSM) communications standard to enable the cellular handset to operate either at a low band frequency of 900.0 MHz or a high band frequency of 1800.0 MHz by selectively coupling a corresponding input to the shared output. For high-frequency switching devices, such as high-frequency switching devices used in mobile communication devices using the GSM communications standard, there is a continuing need to provide high power handling capability and low harmonic output, such as low third harmonic output.

A conventional high-frequency switching device can include two or more switching blocks, where each switching block includes a number of field effect transistors (FETs) coupled together, and where each switching block is coupled to a separate input and a shared output. The gates of the FETs in each switching block can be coupled to a control voltage input, which can provide a high control voltage to turn on the switching block and a low control voltage to turn off the switching block. To achieve increased power handling capability, the number of FETs in each switching block can be increased. However, increasing the number of FETs in each switching block undesirably increases the semiconductor die area consumed by the switching device. To reduce harmonic output, a first capacitor can be coupled between the gate and drain of the FET in each switching block that is coupled to the shared output of the switching device and a second capacitor can be coupled between the gate and source of the FET in each switching block that is coupled to an input of the switching device. However, this solution does not provide a sufficient reduction in harmonic output for many applications.

Thus, there is a need in the art for a high-frequency switching device that provides increased power handling capability and reduced harmonic output.

SUMMARY OF THE INVENTION

The present invention is directed to a high-frequency switching device with reduced harmonics. The present invention overcomes the need in the art for a high-frequency switching device that provides increased power handling capability and reduced harmonic output.

According to one exemplary embodiment, a low harmonic switching device includes a first switching block including a first multi-gate FET, where the first switching block is coupled to a first input and a shared output of the low harmonic switching device. A first capacitor is coupled between a first gate and a source of the first multi-gate FET and a second capacitor is coupled between a second gate and a drain of the first multi-gate FET so as to cause a reduction in a harmonic amplitude in the shared output. For example, the first multi-gate FET may include a third gate situated between the first gate and the second gate. A first resistor can couple the source of the first multi-gate FET to the drain of the first multi-gate FET. A first control voltage input can be coupled to the first gate and the second gate of the first multi-gate FET. For example, a second resistor can couple the first gate of the first multi-gate FET to the control voltage and a third resistor can couple the second gate of the first multi-gate FET to the first control voltage.

According to this exemplary embodiment, the first switching block can further include a second multi-gate FET, where a source of the second multi-gate FET is coupled to the drain of the first multi-gate FET and a drain of the second multi-gate FET is coupled to the shared output. A third capacitor can be coupled between a first gate and said drain of the second multi-gate FET and a fourth capacitor can be coupled between a second gate and the source of the second multi-gate FET. The low harmonic switching device further includes a second switching block, where the second switching block is coupled to a second input and the shared output of the low harmonic switching device. The first input can be coupled to the shared output when the first control voltage turns the first switching block on and a second control voltage turns the second switching block off and the second input can be coupled to the shared output when the second control voltage turns the second switching block on and the first control voltage turns the first switching block off. Other features and advantages of the present invention will become more readily apparent to those of ordinary skill in the art after reviewing the following detailed description and accompanying drawings.

DETAILED DESCRIPTION OF THE INVENTION

The present invention is directed to a high-frequency switching device with reduced harmonics. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
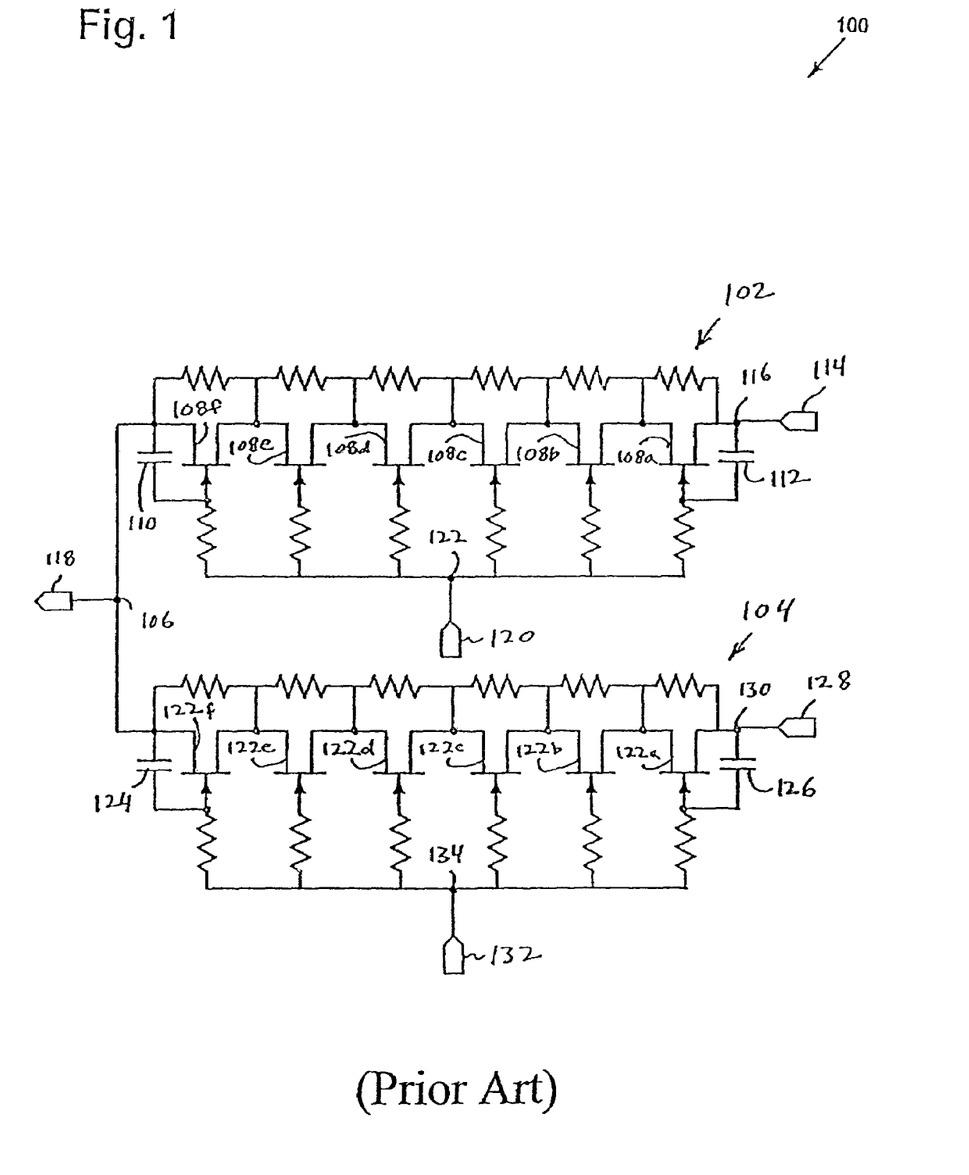
FIG. 1 illustrates a diagram of an exemplary switching device.

FIG. 1 shows a schematic diagram of an exemplary conventional switching device. Conventional switching device 100 includes switching block 102 and 104, which are output-coupled at node 106. Conventional switching device 100 can be a high frequency switching device, such as an RF switching device, and can be utilized in wireless communications devices that use GSM or wideband code-division multiple access (W-CDMA) communications standards, for example.

As shown in FIG. 1, switching circuit section 102 includes FETs 108a, 108b, 108c, 108d, 108e, and 108f (hereinafter "FETs 108a through 108f"), which are coupled together in a series configuration. Each of FETs 108a through 108f can be an N-channel FET (NFET), for example. Switching circuit section 102 also includes capacitor 110, which is coupled between gate and drain terminals of FET 108f, and capacitor 112, which is coupled between gate and source terminals of FET 108a. Also shown in FIG. 1, signal input 114, which is a high-frequency signal input, is coupled to node 116 and signal output 118, which is a high-frequency signal output, is coupled to node 106. Signal output 118 can be coupled to a load, such as an antenna, for example. Further shown in FIG. 1, control voltage input 120 is coupled to the gates of FETs 108a through 108f at node 122.

Also shown in FIG. 1, switching circuit section 104 includes FETs 122a, 122b, 122c, 122d, 122e, and 122f (hereinafter "FETs 122a through 122f"), which are also coupled together in a series configuration. Each of FETs 122a through 122f can be an NFET, for example. Switching circuit section 104 also includes capacitor 124, which is coupled between gate and drain terminals of FET 122f, and capacitor 126, which is coupled between gate and source terminals of FET 122a. Further shown in FIG. 1, signal input 128, which is a high-frequency signal input, is coupled to node 130 and control voltage input 132 is coupled to the gates of FETs 108a through 108f at node 134.

During operation of conventional switching device 100, switching circuit section 102 can be turned on by applying a high voltage, which can be between 2.4 and 5.0 volts, for example, at control voltage input 120 and switching circuit section 104 can be turned off by applying a low voltage, which can be approximately 0.0 volts, for example, at control voltage input 132 and vice versa. When switching circuit section 102 is turned on and switching circuit section 104 is turned off, for example, an RF signal, such as a 900.0 MHz low band GSM signal, at signal input 114 is allowed to pass through FETs 108a through 108f to signal output 118 and another RF signal, such as an 1800.0 MHz high band GSM signal, at signal input 128 is prevented from passing through FETs 122a through 122f to signal output 118.

When switching circuit section 102 is turned on and switching circuit 104 is turned off, an RF signal at signal output 118 provides a high output voltage at node 106, which is divided between gate/drain and gate/source junctions of each of FETs 122a through 122f. Although FETs 122a through 122f in switching circuit section 104 are turned off when switching circuit section 102 is turned on, if the output voltage at node 106 is too high, one or more of FETs 122a through 122f may turn on, which can cause an undesirable increase in amplitude of the third harmonic of the RF signal at signal output 118. Capacitors 124 and 126 are utilized to reduce third harmonic amplitude by reducing the voltage swing at the gate/drain junction of FET 122f and the gate/source junction of FET 122a, respectively. Similarly, when switching circuit section 104 is turned on and switching circuit section 102 is turned off, capacitors 110 and 112 are utilized to reduce third harmonic amplitude by reducing the voltage swing at the gate/drain junction of FET 108f and the gate/source junction of FET 108a, respectively.

However, although capacitors 110 and 112 in switching circuit section 102 and capacitors 124 and 126 in switching circuit section 104 provide some third harmonic amplitude reduction, third harmonic amplitude provided by conventional switching device 100 is undesirably high at low control voltages. For example, third harmonic amplitude provided by conventional switching device 100 increases significantly for a control voltage below approximately 3.0 volts.

Figure 2:
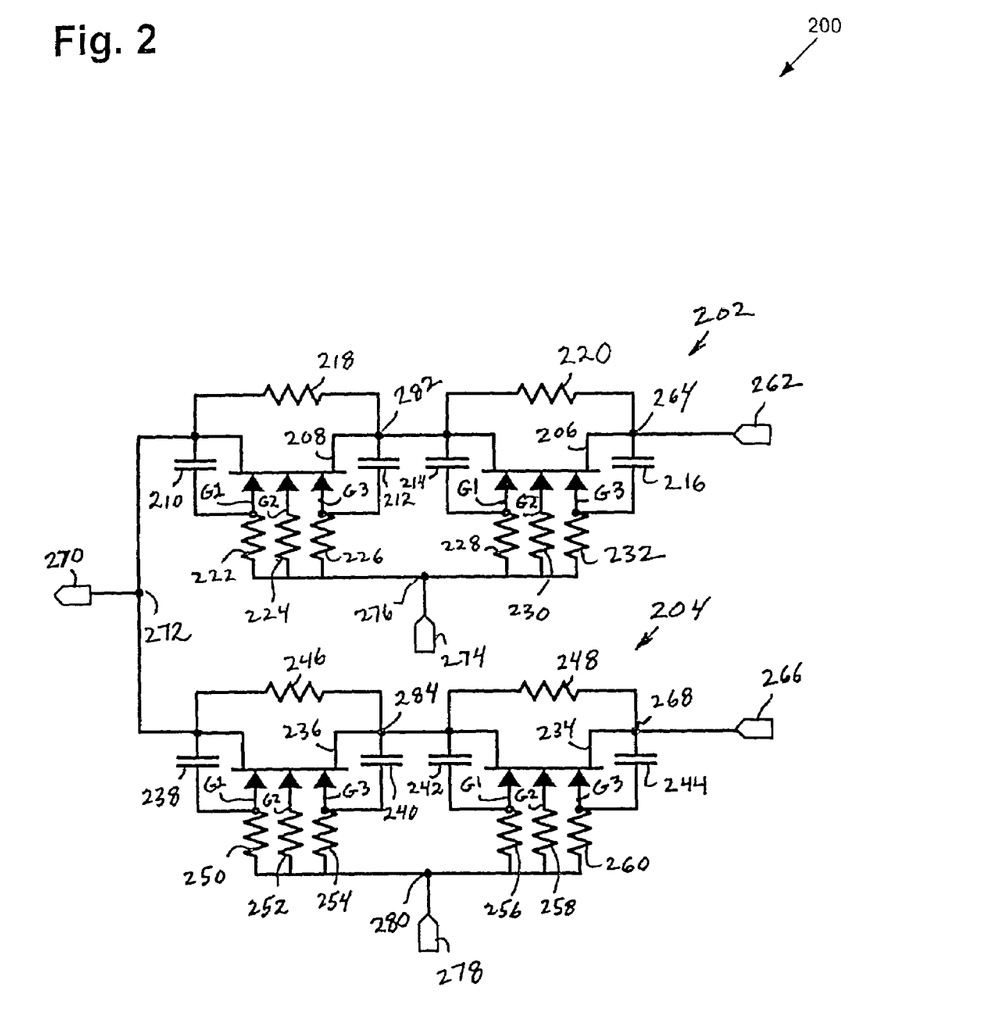
FIG. 2 illustrates a diagram of an exemplary switching device in accordance with one embodiment of the present invention.

FIG. 2 shows a schematic diagram of an exemplary switching device in accordance with one embodiment of the present invention. Low harmonic low harmonic switching device 200 includes switching block 202 and 204. Low harmonic switching device 200 can be a high frequency switching device, such as an RF switching device. In other embodiments, low harmonic switching device 200 can include more than two switching blocks. Low harmonic switching device 200 also includes signal inputs 262 and 266, signal output 270, which is also referred to as a "shared output" in the present application, and control voltage inputs 274 and 278. Low harmonic switching device 200 can be utilized in wireless communications devices that use GSM or W-CDMA communications standards, for example. However, low harmonic switching device 200 can also be utilized in other high frequency switching applications where reduced third harmonic level and increased power handling capability is desired. Switching circuit section 202 includes FETs 206 and 208, capacitors 210, 212, 214, and 216, and resistors 218, 220, 222, 224, 226, 228, 230, and 232. Switching circuit section 204 includes FETs 234 and 236, capacitors 238, 240, 242, and 244, and resistors 246, 248, 250, 252, 254, 256, 258, and 260.

As shown in FIG. 2, signal input 262, which can be a high-frequency signal input, such as an RF signal input, is coupled to switching circuit section 202 at node 264, signal input 266, which can also be a high-frequency signal input, such as an RF signal input, is coupled to switching circuit section 204 at node 268, and signal output 270, which can be a high-frequency signal output, such as an RF signal output, is coupled to the signal outputs of switching block 202 and 204 at node 272. Signal output 270 can be coupled to a load (not shown in FIG. 2), such as an antenna, for example. Also shown in FIG. 2, control voltage inputs 274 and 278 are coupled to nodes 276 and 280 of switching block 202 and 204, respectively. Control voltage inputs 274 and 278 can receive a high control voltage (VH), which can be between 2.4 volts and 5.0 volts, for example, to turn on respective switching block 202 and 204. Control voltage inputs 274 and 278 can also receive a low control voltage (VL), which can be approximately 0.0 volts, for example, to turn off respective switch circuit sections 202 and 204.

Further shown in FIG. 2, the source terminal of FET 206 is coupled to first terminals of resistor 220 and capacitor 216 at node 264 and the drain terminal of FET 206 is coupled to a second terminal of resistor 220 and a first terminal of capacitor 214 at node 282. For example, resistor 220 might have a resistance of at least 10.0 kilo-ohms (kOhms). Also shown in FIG. 2, gate terminal G1 of FET 206 is coupled to a second terminal of capacitor 214 and a first terminal of resistor 228, gate terminal G2 of FET 206 is coupled to a first terminal of resistor 230, and gate terminal G3 of FET 206 is coupled to a first terminal of resistor 232 and a second terminal of capacitor 216. FET 206 can be a multi-gate FET, such as a multi-gate NFET. In the present embodiment, FET 206 can have three gates. In other embodiments, FET 206 can have two gates or more than three gates. Capacitors 214 and 216 might each have a capacitance of at least 2.0 picofarads (pF), for example. Also shown in FIG. 2, the second terminals of resistors 228, 230, and 232 are coupled to control voltage input 274 at node 276. For example, resistors 228, 230, and 232 might each have a resistance of between 5.0 kOhms and 10.0 kOhms.

Further shown in FIG. 2, the source terminal of FET 208 is coupled to first terminals of resistor 218 and capacitor 212 at node 282 and the drain terminal of FET 206 is coupled to a second terminal of resistor 218 and a first terminal of capacitor 210 at node 272. Resistor 218 can have a resistance that is substantially equal to the resistance of resistor 220. Also shown in FIG. 2, gate terminal G1 of FET 208 is coupled to a second terminal of capacitor 210 and a first terminal of resistor 222, gate terminal G2 of FET 208 is coupled to a first terminal of resistor 224, and gate terminal G3 of FET 208 is coupled to a first terminal of resistor 226 and a second terminal of capacitor 212. FET 208 can be a multi-gate FET, such as a multi-gate NFET. In the present embodiment, FET 208 can have three gates. In other embodiments, FET 208 can have two gates or more than three gates. Capacitors 210 and 212 can have a capacitance that is substantially equal to the capacitance of capacitors 214 and 216, respectively. Also shown in FIG. 2, the second terminals of resistors 222, 224, and 226 are coupled to control voltage input 274 at node 276. Resistors 222, 224, and 226 can have a resistance that is substantially equal to the resistance of resistors 228, 230, and 232, respectively.

Further shown in FIG. 2, the source terminal of FET 234 is coupled to first terminals of resistor 248 and capacitor 244 at node 268 and the drain terminal of FET 234 is coupled to a second terminal of resistor 248 and a first terminal of capacitor 242 at node 284. Resistor 248 can have a resistance that is substantially equal to the resistance of resistor 220. Also shown in FIG. 2, gate terminal G1 of FET 234 is coupled to a second terminal of capacitor 242 and a first terminal of resistor 256, gate terminal G2 of FET 234 is coupled to a first terminal of resistor 258, and gate terminal G3 of FET 234 is coupled to a first terminal of resistor 260 and a second terminal of capacitor 244. FET 234 can be a multi-gate FET, such as a multi-gate NFET. In the present embodiment, FET 234 can have three gates. In other embodiments, FET 234 can have two gates or more than three gates. Capacitors 242 and 244 can have a capacitance that is substantially equal to the capacitance of capacitors 214 and 216, respectively. Also shown in FIG. 2, the second terminals of resistors 256, 258, and 260 are coupled to control voltage input 278 at node 280. Resistors 256, 258, and 260 can have a resistance that is substantially equal to the resistance of resistors 228, 230, and 232, respectively.

Further shown in FIG. 2, the source terminal of FET 236 is coupled to first terminals of resistor 246 and capacitor 240 at node 284 and the drain terminal of FET 236 is coupled to a second terminal of resistor 246 and a first terminal of capacitor 238 at node 272. Resistor 246 can have a resistance that is substantially equal to the resistance of resistor 248. Also shown in FIG. 2, gate terminal G1 of FET 236 is coupled to a second terminal of capacitor 238 and a first terminal of resistor 250, gate terminal G2 of FET 236 is coupled to a first terminal of resistor 252, and gate terminal G3 of FET 236 is coupled to a first terminal of resistor 254 and a second terminal of capacitor 240. FET 236 can be a multi-gate FET, such as a multi-gate NFET. In the present embodiment, FET 236 can have three gates. In other embodiments, FET 236 can have two gates or more than three gates. Capacitors 238 and 240 can have a capacitance that is substantially equal to the capacitance of capacitors 242 and 244, respectively. Also shown in FIG. 2, the second terminals of resistors 222, 224, and 226 are coupled to control voltage input 274 at node 276. Resistors 250, 252, and 254 can have a resistance that is substantially equal to the resistance of resistors 256, 258, and 260, respectively.

The operation of low harmonic switching device 200 will now be discussed. Switching circuit section 202 can be turned on by applying VH (i.e. a high control voltage) to control voltage input 274, which turns on FETs 206 and 208, and switching circuit section 204 can be turned off by applying VL (i.e. a low control voltage) to control voltage input 278, which turns off FETs 234 and 236, and vice versa. Thus, in the embodiment in FIG. 2, either switching circuit section 202 can be turned on and switching circuit section 204 can be turned off, or switching circuit section 202 can be turned off and switching circuit section 204 can be turned on. When switching section 202 is turned on and switching section 204 is turned off, for example, signal input 262 is coupled to signal output 270 such that an RF signal (e.g. a 900.0 MHz low band GSM signal) at signal input 262 is allowed to pass through FETs 206 and 208 to signal output 270. Also, signal input 266 is de-coupled from signal output 270 such that another RF signal (e.g. an 1800.0 MHz high band GSM signal) at signal input 266 is prevented from passing through FETs 234 and 236 to signal output 270.

When switching circuit section 202 is turned on and switching circuit section 204 is turned off, an RF signal at signal output 270 provides a peak RF voltage (Vrf) at node 272, which is equally divided between gate/drain and gate/source junctions of each of FETs 234 and 236. When switching circuit section 204 is turned on and switching circuit section 202 is turned off, the RF signal at signal output 270 provides Vrf at node 272, which is equally divided between gate/drain and gate/source junctions of each of FETs 206 and 208. When switching circuit section 204 is turned off, for example, a high Vrf can cause the voltage at the gate/drain and gate/source junctions of FETs 234 and 236 to increase such that FET 234 and/or FET 236 turns on, which can cause an undesirable increase in harmonic levels (i.e. amplitudes), such as the amplitude of the third harmonic.

In the embodiment in FIG. 2, capacitors 210, 214, 238, and 242, which are coupled between gate (G1) and drain of respective FETs 208, 206, 236, and 234, and capacitors 212, 216, 240, and 244, which are coupled between gate (G3) and source of respective FETs 208, 206, 236 and 234, are provided to attenuate the voltage at gate/drain and gate/source junctions of FETs 208, 206, 236 and 234. Thus, when switching circuit section 202 is turned off, the voltage at gate/drain and gate/source junctions of FETs 206 and 208 is attenuated, which reduces the amplitude of third harmonics generated by switching circuit 202. Similarly, and when switching circuit section 204 is turned off, the voltage at gate/drain and gate/source junctions of FETs 234 and 236 is attenuated, which reduces the amplitude of third harmonics generated by switching circuit 204.

Thus, by providing capacitors between gate (G1) and drain and between gate (G3) and source of each FET in each switching circuit section, the embodiment of the invention in FIG. 2 advantageously achieves a high-frequency switching device having reduced third harmonic amplitude compared to conventional switching device 100 in FIG. 1. For example, the third harmonic amplitude begins to increase at a control voltage of approximately 2.8 volts in high-frequency low harmonic switching device 200 in FIG. 2. In contrast, the third harmonic amplitude begins to significantly increase at a higher control voltage of approximately 3.0 volts in conventional switching device 100 in FIG. 1. As a result, the embodiment of the invention in FIG. 2 can advantageously operate effectively at a lower control voltage compared to conventional switching device 100.

Additionally, by providing capacitors between gate (G1) and drain and between gate (G3) and drain of each FET in each switching circuit section to reduce third harmonic amplitude, the embodiment of the invention in FIG. 2 also provides a high-frequency switching device that has increased power handling capability compared to the conventional high-frequency switching device in FIG. 1. Furthermore, by utilizing multi-gate FETs in place of single gate FETs, the embodiment of the invention in FIG. 2 provides a high-frequency switching device that advantageously occupies a smaller area on a semiconductor die compared to the conventional high-frequency switching device in FIG. 1.

Figure 3:
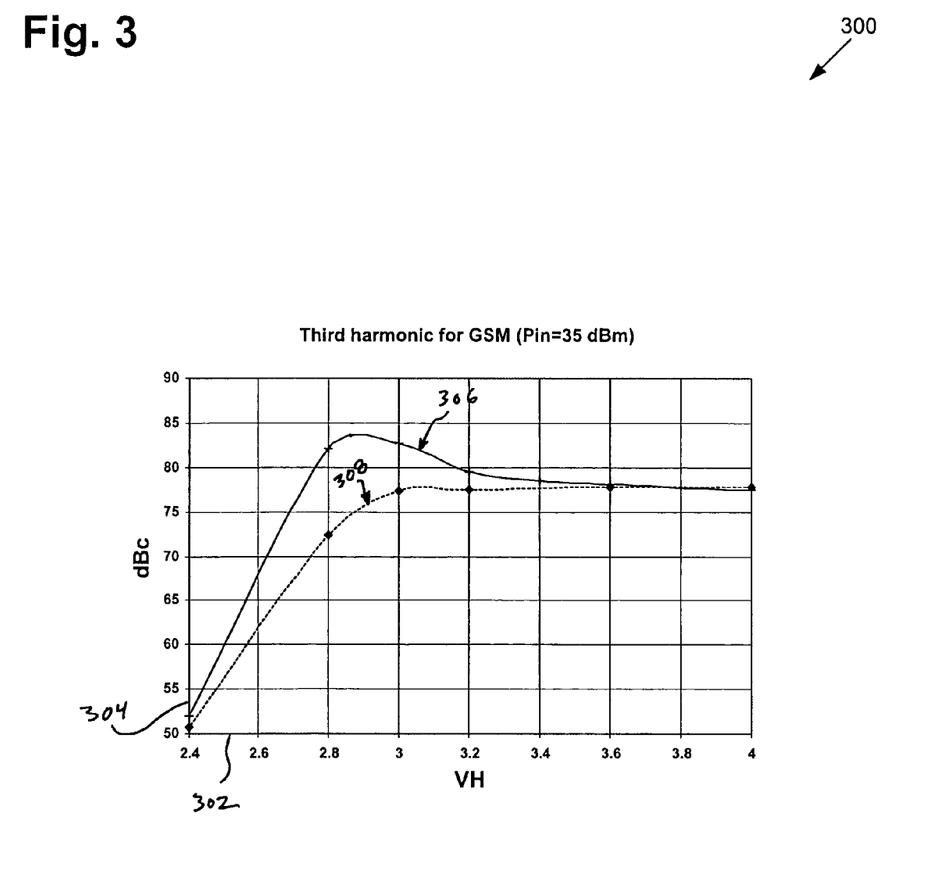
FIG. 3 is a graph showing a fundamental/third harmonic difference curve for an exemplary switching device in accordance with one embodiment of the present invention.

FIG. 3 shows exemplary graph 300 including an exemplary fundamental/third harmonic difference curve in accordance with one embodiment of the present invention. Graph 300 includes VH axis 302, dBc axis 304, and fundamental/third harmonic difference curves 306 and 308. VH axis 302 corresponds to an exemplary range of control voltages are can be utilized to turn on switching block of conventional switching device 100 in FIG. 1 and low harmonic switching device 200 in FIG. 2 and dBc axis 304 corresponds to an exemplary range of differences between a fundamental frequency of an RF input signal (e.g. a GSM input signal at an input power of approximately 35.0 dBm) and a third harmonic of the fundamental frequency in dBm).

Fundamental/third harmonic difference curve 306 corresponds to an exemplary difference between a fundamental frequency and a third harmonic as measured in dBm vs. VH for an embodiment of the invention's switching device in FIG. 2 and fundamental/third harmonic difference curve 308 corresponds to an exemplary difference between the fundamental frequency and the third harmonic as measured in dBm vs. VH for conventional switching circuit 100 in FIG. 1.

In the example shown in graph 300, fundamental/third harmonic difference curve 308 begins to roll off (i.e. begins to significantly decrease) at approximately 3.0 volts, while fundamental/third harmonic difference curve 306 begins to roll off at approximately 2.8 volts. As shown in graph 300, third harmonic amplitude begins to increase at a lower control voltage for low harmonic switching device 200 in FIG. 2 compared to conventional switching device 100 in FIG. 1. Thus, the embodiment of the present invention in FIG. 2 achieves a switching device that can effectively operate at a lower control voltage with lower third harmonic amplitude compared to conventional switching device 100 in FIG. 1.

Figure 4:
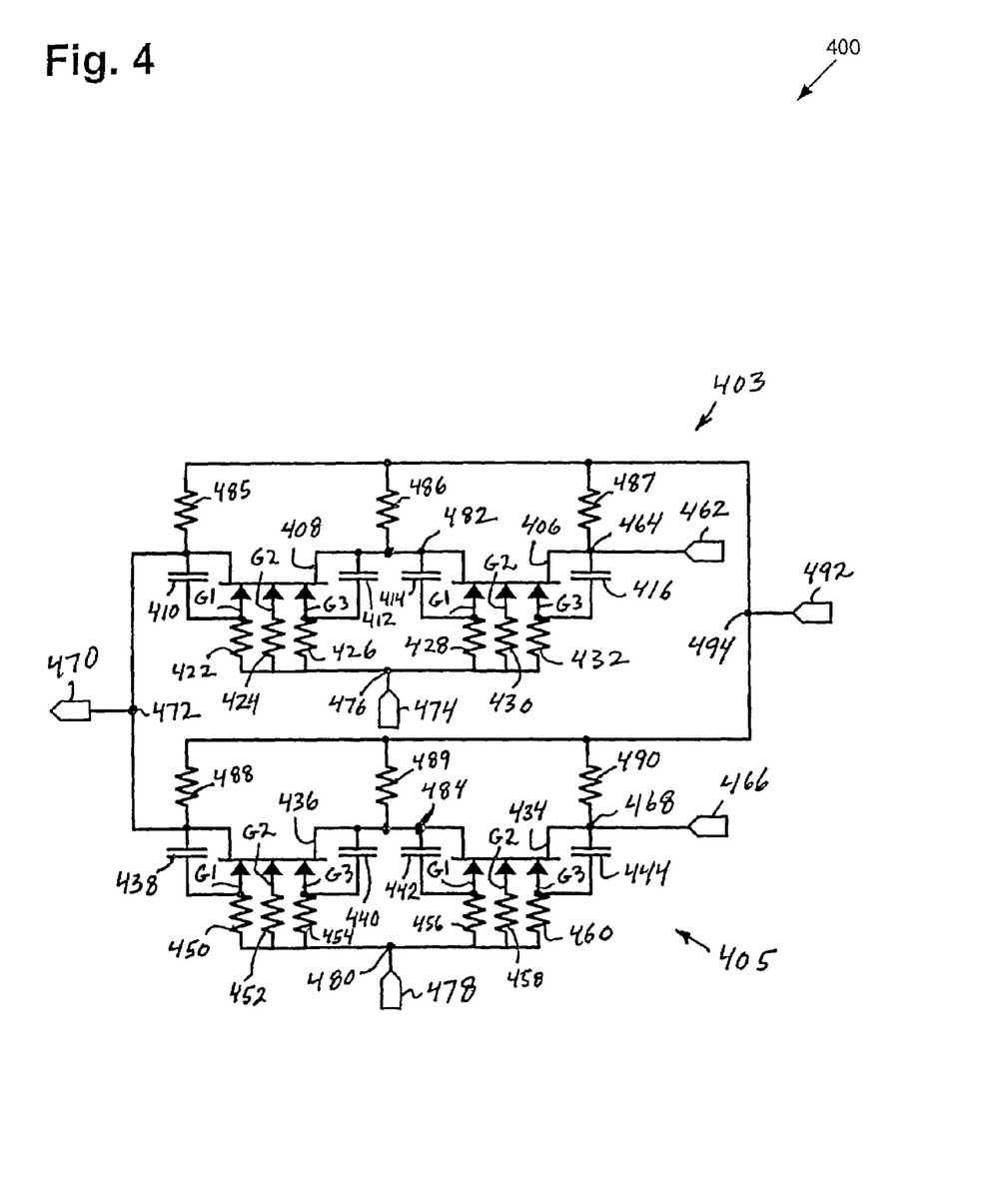
FIG. 4 illustrates a diagram of an exemplary switching device in accordance with another embodiment of the present invention.

FIG. 4 shows a schematic diagram of an exemplary switching device in accordance with one embodiment of the present invention. FETs 406, 408, 434, and 436, capacitors 410, 416, 438, and 444, resistors 422, 424, 426, 428, 430, 432, 450, 452, 454, 456, 458, and 460, signal inputs 462 and 466, signal output 470, and control voltage inputs 474 and 478 in FIG. 4 correspond, respectively, to FETs 206, 208, 234, and 236, capacitors 210, 216, 238, and 244, resistors 222, 224, 226, 228, 230, 232, 250, 252, 254, 256, 258, and 260, signal inputs 262 and 266, signal output 270, and control voltage inputs 274 and 278 in FIG. 2. Low harmonic switching device 400 includes switching block 403 and 405. Low harmonic switching device 400 can be a high frequency switching device, such as an RF switching device. In other embodiments, low harmonic switching device 400 can include more than two switching block. Low harmonic switching device 400 also includes signal inputs 462 and 466, signal output 470, which is also referred to as a "shared output" in the present application, and control voltage inputs 474 and 478.

Low harmonic switching device 400 can be utilized in wireless communications devices that use GSM or W-CDMA communications standards, for example. However, low harmonic switching device 400 can also be utilized in other high frequency switching applications where reduced third harmonic level and increased power handling capability is desired. Switching circuit section 403 includes FETs 406 and 408, capacitors 410, 412, 414, and 416, and resistors 418, 420, 422, 424, 426, 428, 430, 432, 485, 486, and 488. Switching circuit 405 includes FETs 434 and 436, capacitors 438, 440, 442, and 444, and resistors 446, 448, 450, 452, 454, 456, 458, 460, 488, 489, and 490.

As shown in FIG. 4, signal input 462, which can be a high-frequency signal input, such as an RF signal input, is coupled to switching circuit section 403 at node 464, signal input 466, which can also be a high-frequency signal input, such as an RF signal input, is coupled to switching circuit section 405 at node 468, and signal output 470, which can be a high-frequency signal output, such as an RF signal output, is coupled to the signal outputs of switching block 403 and 405 at node 472. Signal output 470 can be coupled to a load (not shown in FIG. 4), such as an antenna, for example. Also shown in FIG. 4, control voltage inputs 474 and 478 are coupled to nodes 476 and 480 of switching block 402 and 404, respectively. Control voltage inputs 474 and 478 can receive a high control voltage (VH), which can be between 2.4 volts and 5.0 volts, for example, to turn on respective switching block 403 and 405. Control voltage inputs 474 and 478 can also receive a low control voltage (VL), which can be approximately 0.0 volts, for example, to turn off respective switch circuit sections 403 and 405. Further shown in FIG. 4, reference voltage 492 is coupled to first terminals of resistors 485, 486, 487, 488, 489, and 490 at node 494. Reference voltage 492 is a DC voltage and is substantially equal to VH (i.e. the high control voltage utilized to turn on switching block 403 and 405). In the embodiment of the invention in FIG. 4, reference voltage 492 is utilized to tie the source and drains of FETs 406, 408, 434, and 436 to a common DC voltage (i.e. VH).

Also shown in FIG. 4, the source terminal of FET 406 is coupled to the second terminal of resistor 487 and the first terminal of capacitor 416 at node 464 and the drain terminal of FET 406 is coupled to a second terminal of resistor 486 and a first terminal of capacitor 414 at node 482. Further shown in FIG. 4, gate terminal G1 of FET 406 is coupled to a second terminal of capacitor 414 and a first terminal of resistor 428, gate terminal G2 of FET 406 is coupled to a first terminal of resistor 430, and gate terminal G3 of FET 406 is coupled to a first terminal of resistor 432 and a second terminal of capacitor 416. Further shown in FIG. 4, the second terminals of resistors 428, 430, and 432 are coupled to control voltage input 474 at node 476.

Also shown in FIG. 4, the source terminal of FET 408 is coupled to second terminal of resistor 486 and a first terminal of capacitor 412 at node 482 and the drain terminal of FET 406 is coupled to a second terminal of resistor 485 and a first terminal of capacitor 410 at node 472. Further shown in FIG. 4, gate terminal G1 of FET 408 is coupled to a second terminal of capacitor 410 and a first terminal of resistor 422, gate terminal G2 of FET 408 is coupled to a first terminal of resistor 424, and gate terminal G3 of FET 408 is coupled to a first terminal of resistor 426 and a second terminal of capacitor 412. Also shown in FIG. 4, the second terminals of resistors 422, 424, and 426 are coupled to control voltage input 474 at node 476.

Further shown in FIG. 4, the source terminal of FET 434 is coupled to the second terminal of resistor 490 and the first terminal of capacitor 444 at node 468 and the drain terminal of FET 434 is coupled to a second terminal of resistor 489 and a first terminal of capacitor 442 at node 484. Further shown in FIG. 4, gate terminal G1 of FET 434 is coupled to a second terminal of capacitor 442 and a first terminal of resistor 456, gate terminal G2 of FET 434 is coupled to a first terminal of resistor 458, and gate terminal G3 of FET 434 is coupled to a first terminal of resistor 460 and a second terminal of capacitor 444. Also shown in FIG. 4, the second terminals of resistors 456, 458, and 460 are coupled to control voltage input 478 at node 480.

Further shown in FIG. 4, the source terminal of FET 436 is coupled to second terminal of resistor 489 and a first terminal of capacitor 440 at node 484 and the drain terminal of FET 436 is coupled to a second terminal of resistor 488 and a first terminal of capacitor 438 at node 472. Also shown in FIG. 4, gate terminal G1 of FET 436 is coupled to a second terminal of capacitor 438 and a first terminal of resistor 450, gate terminal G2 of FET 436 is coupled to a first terminal of resistor 452, and gate terminal G3 of FET 436 is coupled to a first terminal of resistor 454 and a second terminal of capacitor 440. Further shown in FIG. 4, the second terminals of resistors 450, 452, and 454 are coupled to control voltage input 478 at node 480.

The operation of low harmonic switching device 400 will now be discussed. Switching circuit section 403 can be turned on by applying VH (i.e. a high control voltage) to control voltage input 474, which turns on FETs 406 and 408, and switching circuit section 405 can be turned off by applying VL (i.e. a low control voltage) to control voltage input 478, which turns off FETs 434 and 436, and vice versa. Thus, either switching circuit section 403 can be turned on and switching circuit section 405 can be turned off, or switching circuit section 403 can be turned off and switching circuit section 405 can be turned on. When switching section 403 is turned on and switching section 405 is turned off, for example, an RF signal (e.g. a 900.0 MHz low band GSM signal) at signal input 462 is allowed to pass through FETs 406 and 408 to signal output 470. Also, signal input 466 is de-coupled from signal output 470 such that another RF signal (e.g. an 1800.0 MHz high band GSM signal) at signal input 466 is prevented from passing through FETs 434 and 436 to signal output 470.

When switching circuit section 403 is turned on and switching circuit section 405 is turned off, an RF signal at signal output 470 provides a peak RF voltage (Vrf) at node 474, which is equally divided between gate/drain and gate/source junctions of each of FETs 434 and 436. When switching circuit section 405 is turned on and switching circuit section 403 is turned off, the RF signal at signal output 470 provides Vrf at node 472, which is equally divided between gate/drain and gate/source junctions of each of FETs 406 and 408.

When switching circuit section 405 is turned off, for example, a high Vrf can cause the voltage at the gate/drain and gate/source junctions of FETs 434 and 436 to increase such that FET 434 and/or FET 436 turns on, which can cause an undesirable increase in harmonic levels (i.e. amplitudes), such as the amplitude of the third harmonic. However, in the embodiment of the invention in FIG. 4, the sources and drains of FETs 406, 408, 434, and 436 are coupled to reference voltage 492, which is substantially equal to VH. Thus, the sources and drains of FETs 406, 408, 434, and 436 are set to a predetermined DC voltage (i.e. VH). In contrast, in low harmonic switching device 200 in the embodiment in FIG. 2, the sources and drains of FETs 206, 208, 234, and 236 are floating.

Assume, for example, that VH=3.0 volts, VL=0.0 volt, pinch-off voltage (Vpinch) is equal to −1.0 volts, and the threshold voltage (Vthreshold) of the FETs in the embodiments in FIGS. 2 and 4 is equal to 0.3 volt. Additionally, assume that switching circuit section 202 in FIG. 2 is on and switching circuit section 204 is off and switching circuit section 403 in FIG. 4 is on and switching circuit section 405 is off. For switching circuit section 202, the source and drain voltages of FETs 206 and 208 will be VH minus Vthreshold (i.e. 3.0 volts−0.3 volts), which is equal to 2.7 volts. For switching circuit section 204, since VL=0.0 volts, the gate/source and gate/drain voltages of FETs 234 and 236 will be −2.7 volts.

In contrast, in the embodiment of the invention in FIG. 4, the source and drain voltages of the FETs are set to VH, which is equal to 3.0 volts in the present example. Thus, in switching circuit section 405, which is switched off, the gate/source and gate/drain voltages of FETs 434 and 436 will be at −3.0 volts instead of −2.7 volts. Thus, since the gate/source voltage and gate/drain voltage of FETs 434 and 436 is more negative that the gate/source voltage and gate/drain voltage of FETs 234 and 236, a greater increase in Vrf (at node 472) is required to turn on FETs 434 and 436 than is required to turn on FETs 234 and 236. Thus, by setting the sources and drains to VH, the embodiment of the invention in FIG. 4 achieves greater control over the FETs in a switching circuit section that is turned off compared to the control achieved over the FETs in a turned-off switching circuit section in embodiment of the invention in FIG. 2. Thus, by setting the sources and drains to VH, the embodiment of the invention in FIG. 4 achieves a further reduction in third harmonic amplitude at low control voltages compared to the third harmonic amplitude reduction achieved in embodiment of the invention in FIG. 2.

Also, in embodiment of the invention in FIG. 4, capacitors 410, 414, 438, and 442, which are coupled between gate (G1) and drain of respective FETs 408, 406, 436, and 434, and capacitors 412, 416, 440, and 444, which are coupled between gate (G3) and source of respective FETs 408, 406, 436 and 434, are provided to attenuate the voltage at gate/drain and gate/source junctions of FETs 408, 406, 436 and 434.

By providing capacitors between gate (G1) and drain and between gate (G3) and drain of each FET in each switching circuit section and by setting source and drain voltages of each FET to VH, the embodiment of the invention in FIG. 4 advantageously achieves a high-frequency switching device having a significantly reduced third harmonic amplitude compared to conventional switching device 100 in FIG. 1. As a result, the embodiment of the invention in FIG. 4 can advantageously operate effectively at a significantly lower control voltage compared to conventional switching device 100.

Additionally, by providing capacitors between gate (G1) and drain and between gate (G3) and drain of each FET in each switching circuit section and by setting source and drain voltages of each FET to VH, the embodiment of the invention in FIG. 4 also provides a high-frequency switching device that has significantly increased power handling capability compared to the conventional high-frequency switching device in FIG. 1. Furthermore, by utilizing multi-gate FETs in place of single gate FETs, the embodiment of the invention in FIG. 4 provides a high-frequency switching device that advantageously occupies a smaller area on a semiconductor die compared to the conventional high-frequency switching device in FIG. 1.

Figure 5:
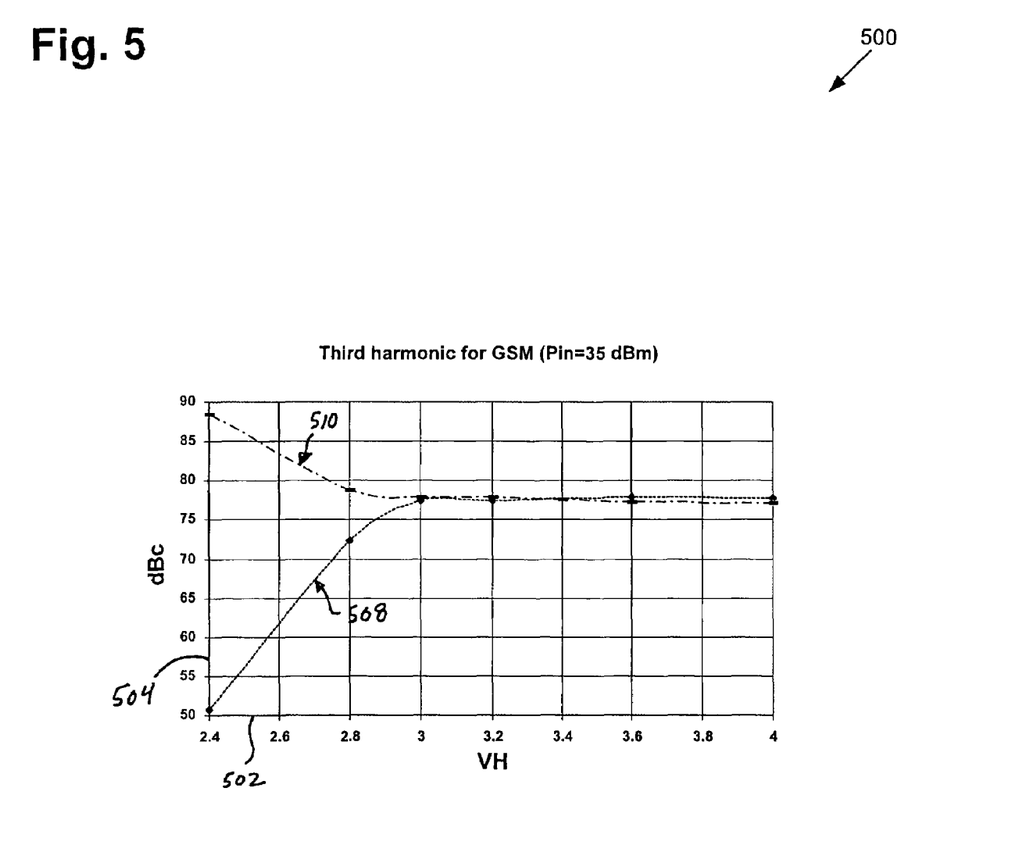
FIG. 5 is a graph showing a fundamental/third harmonic difference curve for an exemplary switching device in accordance with another embodiment of the present invention.

FIG. 5 shows exemplary graph 500 including an exemplary fundamental/third harmonic difference curve in accordance with one embodiment of the present invention. In FIG. 5, VH axis 502, dBc axis 504, and fundamental/third harmonic difference curve 508 correspond, respectively, to VH axis 302, dBc axis 304, and fundamental/third harmonic difference curve 308 in graph 300 in FIG. 3. Fundamental/third harmonic difference curve 510 corresponds to an exemplary difference between a fundamental frequency and a third harmonic as measured in dBm vs. VH for an embodiment of the invention's switching device in FIG. 4 and fundamental/third harmonic difference curve 508 corresponds to an exemplary difference between the fundamental frequency and the third harmonic as measured in dBm vs. VH for conventional switching circuit 100 in FIG. 1.

In the example shown in graph 500, fundamental/third harmonic difference curve 508 begins to roll off (i.e. begins to significantly decrease) at approximately 3.0 volts, while fundamental/third harmonic difference curve 510 begins to increase at approximately 2.8 volts. Thus, as shown in graph 500, the embodiment of the invention in FIG. 4 provides a significant reduction in third harmonic amplitude for VH less than approximately 3.0 volts compared to conventional switching circuit 100. Thus, the embodiment of the present invention in FIG. 4 achieves a switching device that can effectively operate at a significantly lower control voltage with substantially lower third harmonic amplitude compared to conventional switching device 100 in FIG. 1.

Thus, as discussed above, by providing capacitors between gate (G1) and drain and between gate (G3) and drain of each FET in each switching circuit section of a switching device, the embodiment of the invention in FIG. 2 advantageously achieves a high-frequency switching device having reduced third harmonic amplitude compared to conventional switching device 100 in FIG. 1. As a result, the embodiment of the invention in FIG. 2 can advantageously operate effectively at a lower control voltage compared to conventional switching device 100.

Also, by providing capacitors between gate (G1) and drain and between gate (G3) and drain of each FET in each switching circuit section and by setting source and drain voltages of each FET to VH, the embodiment of the invention in FIG. 4 advantageously achieves a high-frequency switching device having a significantly reduced third harmonic amplitude compared to conventional switching device 100 in FIG. 1. As a result, the embodiment of the invention in FIG. 4 can advantageously operate effectively at a significantly lower control voltage compared to conventional switching device 100. Additionally, by providing capacitors between gate (G1) and drain and between gate (G3) and drain of each FET in each switching circuit section and by setting source and drain voltages of each FET to VH, the embodiment of the invention in FIG. 4 provides a high-frequency switching device that has significantly increased power handling capability compared to the conventional high-frequency switching device in FIG. 1.

Furthermore, by utilizing multi-gate FETs in place of single gate FETs, the embodiments of the invention in FIGS. 2 and 4 provide a high-frequency switching device that advantageously occupies a smaller area on a semiconductor die compared to the conventional high-frequency switching device in FIG. 1.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a high-frequency switching device with reduced harmonics has been described.

The invention claimed is:

1. A low harmonic switching device comprising:
a first switching block comprising a first multi-gate FET and a second multi-gate FET coupled together in series between a first input and a shared output of said low harmonic switching device, a source of said second multi-gate FET being coupled to a drain of said first multi-gate FET and a drain of said second multi-gate FET being coupled to said shared output;
wherein a first capacitor is coupled between a first gate and a source of said first multi-gate FET and a second capacitor is coupled between a second gate and said drain of said first multi-gate FET so as to cause a reduction in a harmonic amplitude in said shared output.

2. The low harmonic switching device of claim 1, wherein said first multi-gate FET further comprises a third gate situated between said first gate and said second gate.

3. The low harmonic switching device of claim 1, wherein a control voltage input is coupled to said first gate and said second gate of said first multi-gate FET.

4. The low harmonic switching device of claim 1, wherein a third capacitor is coupled between a first gate and said drain of said second multi-gate FET and a fourth capacitor is coupled between a second gate and said source of said second multi-gate FET.

5. The low harmonic switching device of claim 4, wherein a control voltage is coupled to said first gate and said second gate of said first multi-gate FET and said first gate and said second gate of said second multi-gate FET.

6. The low harmonic switching device of claim 1, wherein a resistor couples said source of said first multi-gate FET to said drain of said first multi-gate FET.

7. The low harmonic switching device of claim 3, wherein a first resistor couples said first gate of said first multi-gate FET to said control voltage and a second resistor couples said second gate of said first multi-gate FET to said control voltage.

8. The low harmonic switching device of claim 1, further comprising a second switching block, wherein said second switching block is coupled to a second input and said shared output of said low harmonic switching device.

9. The low harmonic switching device of claim 8, wherein said first input is coupled to said shared output when a first control voltage turns said first switching block on and a second control voltage turns said second switching block off and said second input is coupled to said shared output when said second control voltage turns said second switching block on and said first control voltage turns said first switching block off.

10. A low harmonic switching device comprising:
a first switching block comprising a first multi-gate FET, said first switching block being coupled to a first input and a shared output of said low harmonic switching device;
a second switching block comprising a second multi-gate FET, said second switching block being coupled to a second input and said shared output of said low harmonic switching device;

wherein a reference voltage is coupled to a source and a drain of said first multi-gate FET and to a source and a drain of said second multi-gate FET to cause a reduction in harmonic amplitude in said shared output.

11. The low harmonic switching device of claim 10, wherein a first capacitor is coupled between a first gate and said source of said first multi-gate FET and a second capacitor is coupled between a second gate and said drain of said first multi-gate FET.

12. The low harmonic switching device of claim 11, wherein said first multi-gate FET further comprises a third gate situated between said first gate and said second gate.

13. A low harmonic switching device 11, comprising:
a first switching block comprising a first multi-gate FET, said first switching block being coupled to a first input and a shared output of said low harmonic switching device;
wherein a reference voltage is coupled to said source and said drain of said first multi-gate FET to cause a reduction in harmonic amplitude in said shared output;
wherein a first capacitor coupled between a first gate and a source of said first multi-gate FET and a second capacitor coupled between a second gate and a drain of said first multi-gate FET; and
further comprising a control voltage input, wherein said control voltage input is coupled to said first gate and said second gate of said first multi-gate FET.

14. The low harmonic switching device of claim 13, wherein said control voltage input is configured to provide a low voltage to turn off said first multi-gate FET and a high voltage to turn on said first multi-gate FET, wherein said reference voltage comprises said high voltage.

15. The low harmonic switching device of claim 11, wherein said first switching block further comprises a second multi-gate FET, wherein a source of said second multi-gate FET is coupled to a drain of said first multi-gate FET and a drain of said second multi-gate FET is coupled to said shared output.

16. The low harmonic switching device of claim 15, wherein a third capacitor is coupled between a first gate and said drain of said second multi-gate FET and a fourth capacitor is coupled between a second gate and said source of said second multi-gate FET.

17. The low harmonic switching device of claim 10, wherein said reference voltage is coupled to said source of said first of multi-gate FET by a first resistor and said reference voltage is coupled to said drain of first multi-gate FET by a second resistor.

18. The low harmonic switching device of claim 10, wherein said first input is coupled to said shared output when a first control voltage turns said first switching block on and a second control voltage turns said second switching block off and said second input is coupled to said shared output when said second control voltage turns said second switching block on and said first control voltage turns said first switching block off.

19. The low harmonic switching device of claim 10, further comprising a control voltage input, wherein said control voltage input is coupled to a first gate and a second gate of said first multi-gate FET.

20. The low harmonic switching device of claim 10, wherein said second switching block includes a plurality of multi-gate FET's.

21. The low harmonic switching device of claim 8, wherein said second switching block includes a plurality of multi-gate FET's.

* * * * *